United States Patent
Jung et al.

(10) Patent No.: US 7,955,985 B2
(45) Date of Patent: Jun. 7, 2011

(54) METHOD OF FORMING MICRO PATTERN OF SEMICONDUCTOR DEVICE

(75) Inventors: Woo Yung Jung, Seoul (KR); Yong Chul Shin, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 811 days.

(21) Appl. No.: 12/016,771

(22) Filed: Jan. 18, 2008

(65) Prior Publication Data

US 2009/0004866 A1 Jan. 1, 2009

(30) Foreign Application Priority Data

Jun. 29, 2007 (KR) .................. 10-2007-0065045

(51) Int. Cl.
*H01L 21/302* (2006.01)
*H01L 21/461* (2006.01)

(52) U.S. Cl. ......... 438/706; 438/714; 438/717; 438/725

(58) Field of Classification Search .................. None
See application file for complete search history.

(56) References Cited

U.S. PATENT DOCUMENTS

| 6,576,536 B1 * | 6/2003 | Babcock ................ 438/585 |
| 2005/0020016 A1 * | 1/2005 | Yang et al. ............. 438/278 |
| 2006/0292868 A1 * | 12/2006 | Yoshikawa ............. 438/670 |

FOREIGN PATENT DOCUMENTS

KR 10-2006-0134598 A 12/2006

\* cited by examiner

*Primary Examiner* — Duy-Vu N Deo

(74) *Attorney, Agent, or Firm* — Kilpatrick Townsend & Stockton LLP

(57) ABSTRACT

A method for fabricating a semiconductor device includes forming a target etch layer over a substrate, a first auxiliary layer over the target etch layer, an isolation layer over the first auxiliary layer, and a second auxiliary layer over the isolation layer. A first exposure process is performed, where the first auxiliary layer is in focus and the second auxiliary layer is out of focus. A second exposure process is performed, where the second auxiliary layer in focus and the first auxiliary layer is out of focus. The second auxiliary layer is developed to form first mask patterns. The isolation layer and the first auxiliary layer are etched by using the first mask patterns to form second mask patterns. The second mask patterns are developed to form third mask patterns that are used to facilitate subsequent etching of the target etch layer.

44 Claims, 6 Drawing Sheets

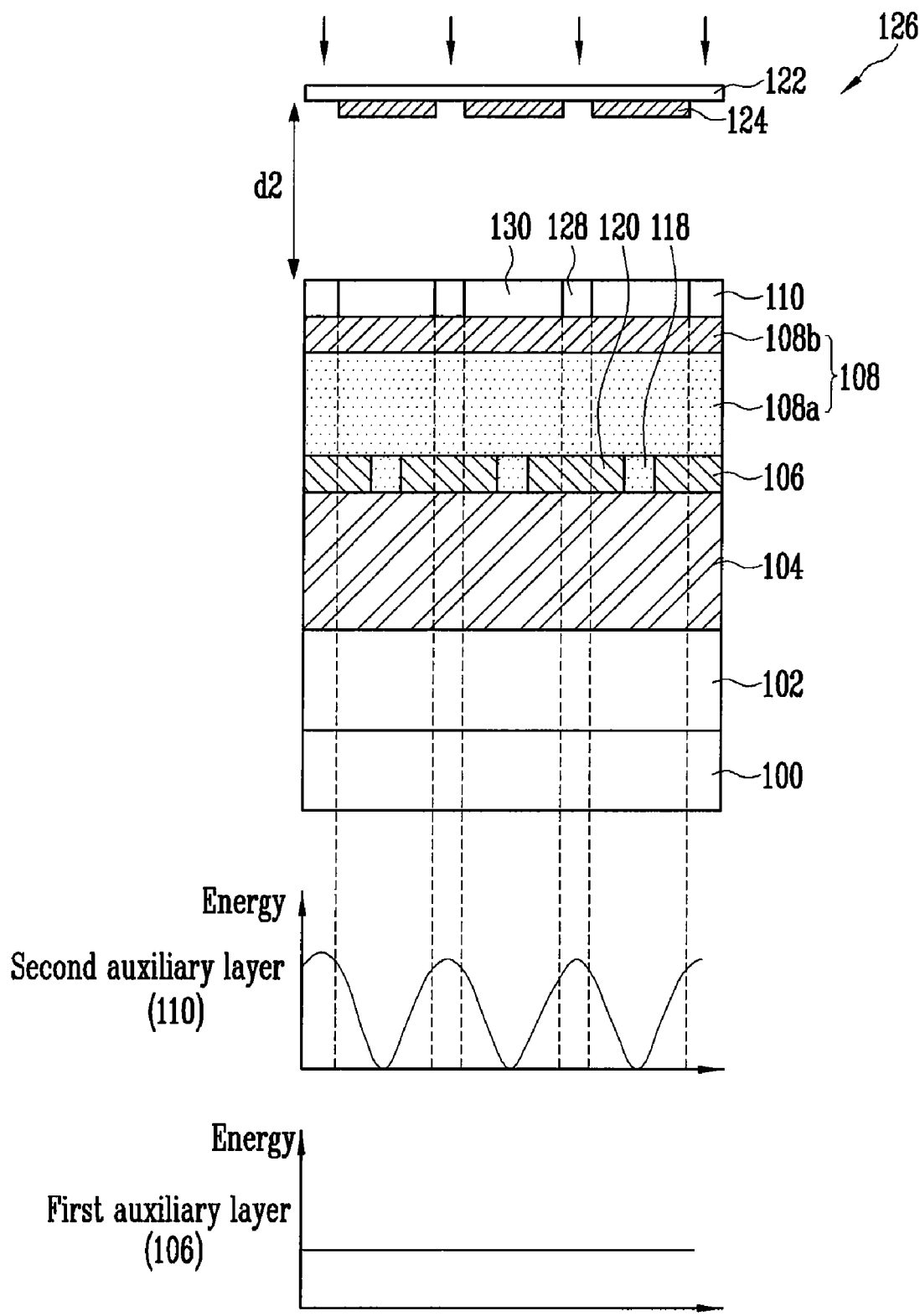

METHOD OF FORMING MICRO PATTERN OF SEMICONDUCTOR DEVICE

CROSS-REFERENCES TO RELATED APPLICATIONS

The present application claims priority to Korean patent application number 10-2007-65045, filed on Jun. 29, 2007, which is incorporated by reference in its entirety.

BACKGROUND OF THE INVENTION

The present invention relates to a semiconductor device and, more particularly, to a method of forming micro patterns in a semiconductor device.

As the level of device integration increases, the size of a minimum line width shrinks. However, the development of exposure equipment for implementing a micro line width required for such a high level of integration of devices may not satisfy the needs.

In order to implement a micro line width needed for such a higher level of integration, several process steps are required. For example, in order to form a hard mask pattern for forming a micro pattern, a double exposure etch tech (DEET) method, a spacer formation method, etc. must be performed. In the event that the DEET method is employed, a critical dimension (CD) becomes poor because of overlay between neighboring patterns. If the spacer formation method is employed, only micro patterns having a simple and uniform CD can be formed.

BRIEF SUMMARY OF THE INVENTION

The present invention is directed towards a method of forming micro patterns of a semiconductor device, in which micro patterns having various forms can be formed by mean of a DEET method while resolving of a poor CD problem because of overlay.

In one embodiment, a method for fabricating a semiconductor device includes forming a target etch layer over a substrate, a first auxiliary layer over the target etch layer, an isolation layer over the first auxiliary layer, and a second auxiliary layer over the isolation layer. A first exposure process is performed, where the first auxiliary layer is in focus and the second auxiliary layer is out of focus. A second exposure process is performed, where the second auxiliary layer in focus and the first auxiliary layer is out of focus. The second auxiliary layer is developed to form first mask patterns. The isolation layer and the first auxiliary layer are etched by using the first mask patterns to form second mask patterns. The second mask patterns are developed to form third mask patterns that are used to facilitate subsequent etching of the target etch layer.

In one embodiment, a hard mask layer is provided between the target etch layer and the first auxiliary layer, wherein the method further comprises etching the hard mask layer using the third mask patterns; and etching the target etch layer using the hard mask layer that has been etched as a mask layer. The first pitch and the second pitch are the same or different from each other.

In a method of forming micro patterns of a semiconductor device according to an aspect of the present invention, a target etch layer, a first auxiliary layer, an isolation layer, and a second auxiliary layer are formed over a semiconductor substrate. A first exposure process is performed by bringing a focus into the first auxiliary layer. A second exposure process is performed by bringing a focus into the second auxiliary layer. The second auxiliary layer is developed to form second auxiliary patterns. The isolation layer and the first auxiliary layer are etched by means of an etch process using the second auxiliary patterns as an etch mask, thus forming first auxiliary patterns. The first auxiliary patterns are developed to form third auxiliary patterns. The target etch layer is etched by employing the third auxiliary patterns.

The target etch layer is formed of an insulating material or a conductive material. A hard mask film is further formed between the target etch layer and the first auxiliary layer. The hard mask film is formed of carbon. The hard mask film is formed of carbon by means of a spin coating method. The first auxiliary layer is formed of a material with a different etch selectivity from that of the isolation layer. The first auxiliary layer is formed of a photoresist film containing silicon (Si).

The first auxiliary layer has a stack structure of a bottom anti-reflective coating (BARC) film containing silicon (Si) and a photoresist film. The isolation layer is formed of a material having a different etch selectivity from that of the first auxiliary layer and the second auxiliary layer. The isolation layer has a stack structure of an organic film and an organic anti-reflection coating (OARC) film. The organic film is formed of an organic material that is easily melted in a developer. The organic film is formed of an emersion top coating material. A thickness of the isolation layer is controlled so that a focus is brought into the first auxiliary layer and a defocus is brought into the second auxiliary layer when the first exposure process is carried out.

The second auxiliary layer is formed of a material with a different etch selectivity from that of the isolation layer. The second auxiliary layer is formed of a photoresist film containing silicon (Si). Exposure regions of the second auxiliary layer are formed between exposure regions of the first auxiliary layer. Exposure regions of the first auxiliary layer and exposure regions of the second auxiliary layer are spaced apart from one another at specific intervals.

At the time of the first exposure process and the second exposure process, an order of the first exposure process and the second exposure process is reversed. At the time of the first exposure process, a focus is brought into the first auxiliary layer by controlling a distance between a mask and a wafer so that exposure regions are formed only in the first auxiliary layer. At the time of the second exposure process, a focus is brought into the second auxiliary layer by controlling a distance between a mask and a wafer so that exposure regions are formed only in the second auxiliary layer.

The isolation layer is etched by means of a dry etch process employing $O_2$ plasma gas. At the time of the etch process of the first auxiliary layer, the second auxiliary patterns are not fully removed, but the isolation layer partially remains.

In a method of forming micro patterns of a semiconductor device according to an another of the present invention, a target etch layer, a hard mask film, a first auxiliary layer, an isolation layer, and a second auxiliary layer are formed over a semiconductor substrate. A first exposure process is formed on the first auxiliary layer to form first exposure regions and non-exposure regions. A second exposure process is formed on the second auxiliary layer to form second exposure regions and non-exposure regions. The second auxiliary layer is developed to form second auxiliary patterns. The isolation layer and the first auxiliary layer are etched by means of an etch process using the second auxiliary patterns as an etch mask, thus forming first auxiliary patterns. The first auxiliary patterns are developed to form third auxiliary patterns. The target etch layer is etched by employing the third auxiliary patterns.

BRIEF DESCRIPTION OF THE DRAWINGS

FIGS. 1A to 1I are cross-sectional views illustrating a method of forming micro patterns of a semiconductor device according to an embodiment of the present invention.

DESCRIPTION OF SPECIFIC EMBODIMENTS

FIGS. 1A to 1I are cross-sectional views illustrating a method of forming micro patterns of a semiconductor device according to an embodiment of the present invention. The method of the present embodiment can be applied to a method of forming micro patterns of a flash memory device or DRAM, or other semiconductor devices.

Figure 1A:
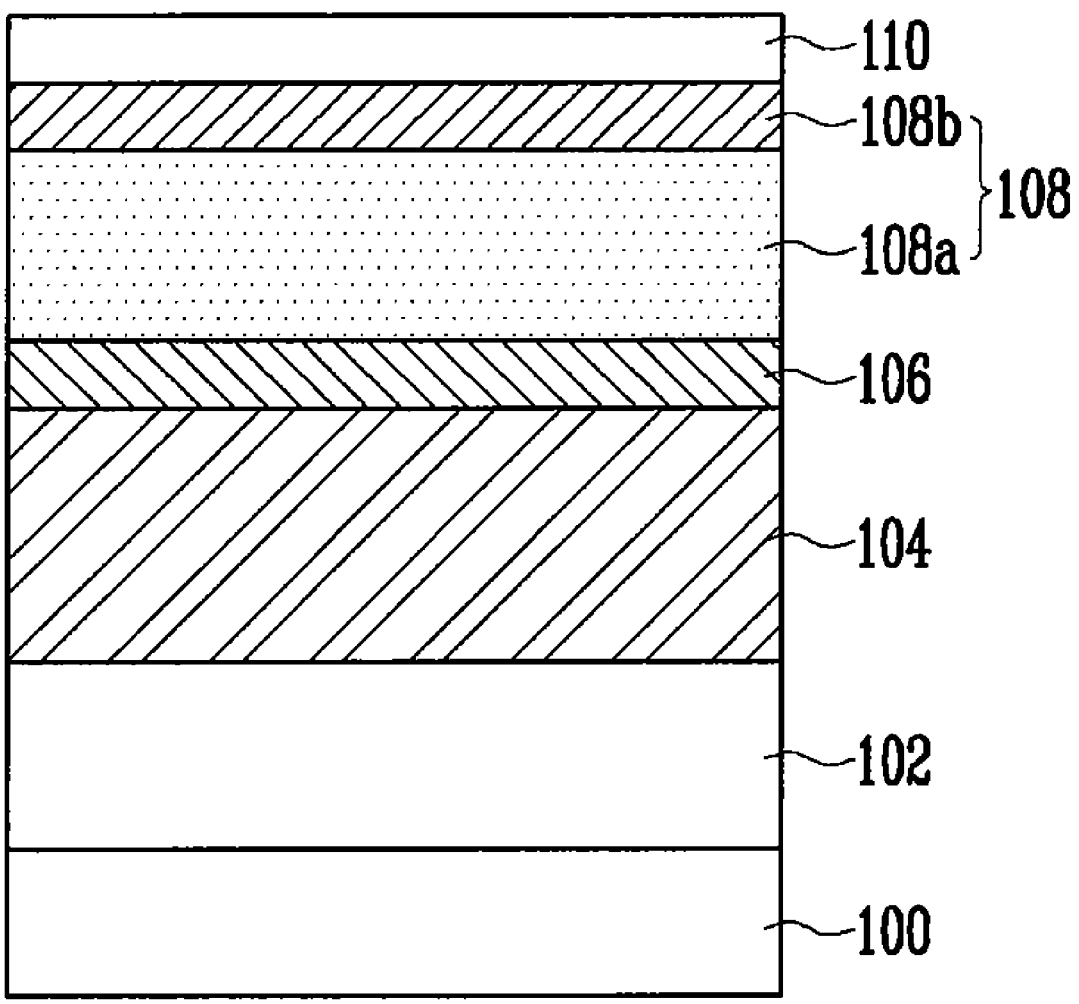

Referring to FIG. 1A, a target etch layer 102 is formed on a semiconductor substrate 100. The target etch layer 102 can be formed of an insulating material or a conductive material. A hard mask film 104 is formed on the target etch layer 102. The hard mask film 104 can be formed from carbon by means of a spin coating method.

A first auxiliary layer 106 is formed on the hard mask film 104. The first auxiliary layer 106 can be formed of a photoresist film containing silicon (Si), or can have a stack structure of a bottom anti-reflective coating (BARC) film containing silicon (Si) and a photoresist film. The stack structure can have a structure in which the BARC film containing silicon (Si) is formed first and then a photoresist film is formed. An isolation layer 108 is formed on the first auxiliary layer 106. The isolation layer 108 can have a stack structure of an organic film 108a and an organic anti-reflection layer (OARC) film 108b. The isolation layer 108 can be formed of a material with an etch selectivity different from that of the first auxiliary layer 106. The organic film 108a can be formed of an organic material that is easily melted in a developer (e.g., an emersion top coating material). The OARC film 108b is formed to passivate the organic film 108a.

The second auxiliary layer 110 is formed on the isolation layer 108. The second auxiliary layer 110 can be formed of a material with a different etch selectivity from that of the isolation layer 108, for example a photoresist film containing silicon (Si).

In the present embodiment, the isolation layer 108 can be formed to a thickness such that during an exposure process for the first auxiliary layer 106 the second auxiliary layer 110 is sufficiently out of focus to keep it below the activation energy, and vice versa, as explained below in more detail.

Figure 1B:
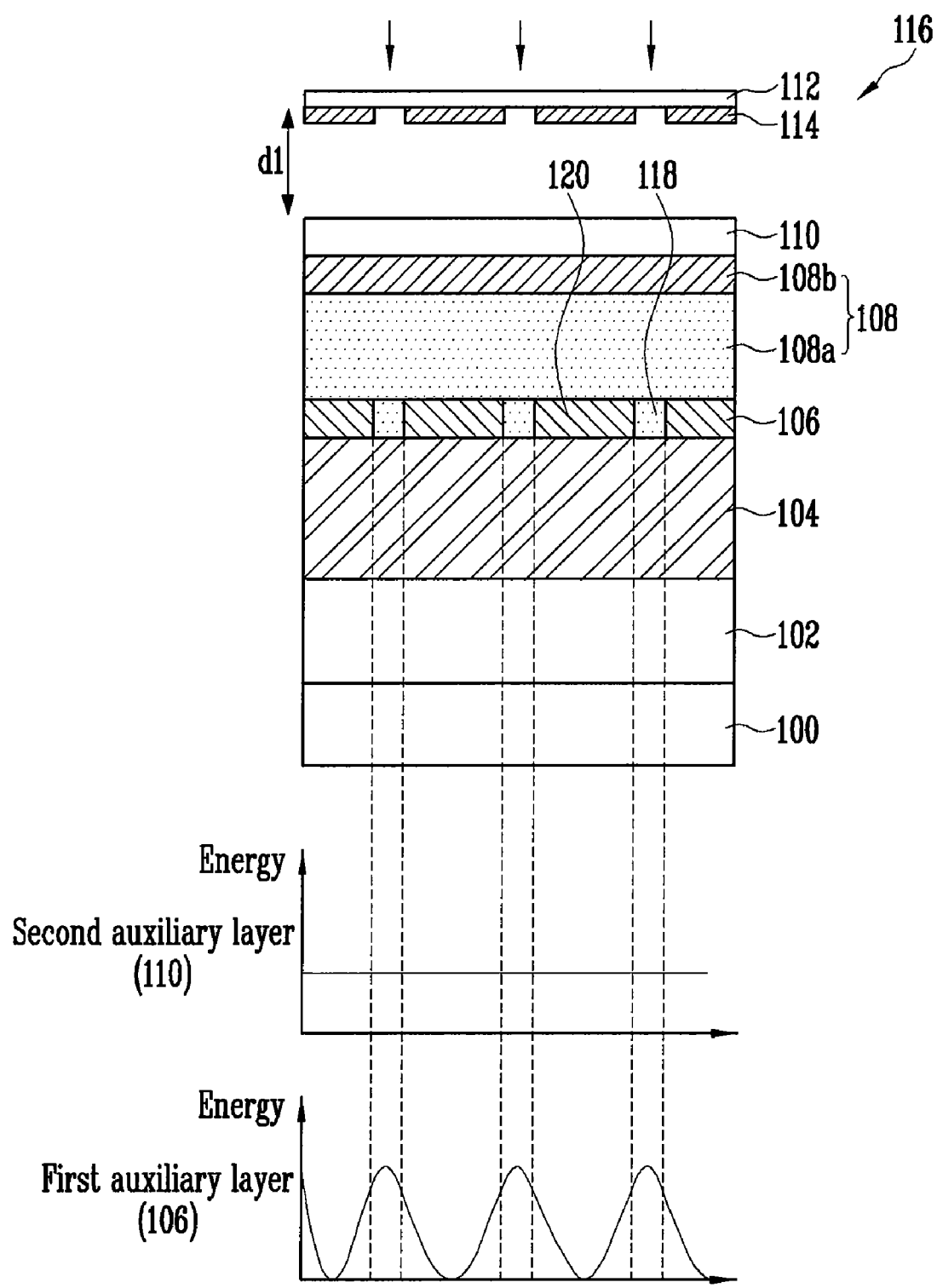

Referring to FIG. 1B, a first exposure process is performed by using a first mask 116 in which chrome patterns 114 are formed at specific intervals on a quartz substrate 112. The first exposure process can be performed in such a manner that the first auxiliary layer 106 is brought into focus by controlling a distance d1 between the first mask 116 and the wafer so that exposure regions 118 are formed only in the first auxiliary layer 106. Accordingly, the first auxiliary layer 106 is divided into the exposure regions 118 and non-exposure regions 120 according to the chrome patterns 114 of the first mask 116. At the time of the first exposure process, the second auxiliary layer 110 is kept out of focus, so that the exposure regions in the second auxiliary layer 110 are not formed. The second auxiliary layer 110 is kept out of focus during the first exposure process by controlling the distance d1 between the first mask 116 and the wafer. Another way is by providing the isolation layer 108 with a suitable thickness.

Referring to FIG. 1C, a second exposure process is carried out by using a second mask 126 in which chrome patterns 124 are formed at specific intervals in a quartz substrate 122. The second exposure process can be performed in such a manner that the second auxiliary layer 110 is brought into focus by controlling a distance d2 between the second mask 126 and the wafer such that exposure regions 128 are formed only in the second auxiliary layer 110. Thus, the second auxiliary layer 110 is divided into the exposure regions 128 and non-exposure regions 130 accordingly to the chrome patterns 124 of the second mask 126. At the time of the second exposure process, the first auxiliary layer 106 is kept out of focus, so that the exposure regions in the first auxiliary layer 106 are not formed. The first auxiliary layer 110 is kept out of focus during the second exposure process by controlling the distance d2 between the second mask 126 and the wafer. Another way is by providing the isolation layer 108 with a suitable thickness.

The exposure regions 128 of the second auxiliary layer 110 are formed between the exposure regions 118 of the first auxiliary layer 106. These exposure regions 118 and 128 are spaced apart from one another at specific intervals in the present embodiment. The order of the first exposure process and the second exposure process can be reversed according to application.

Figure 1D:
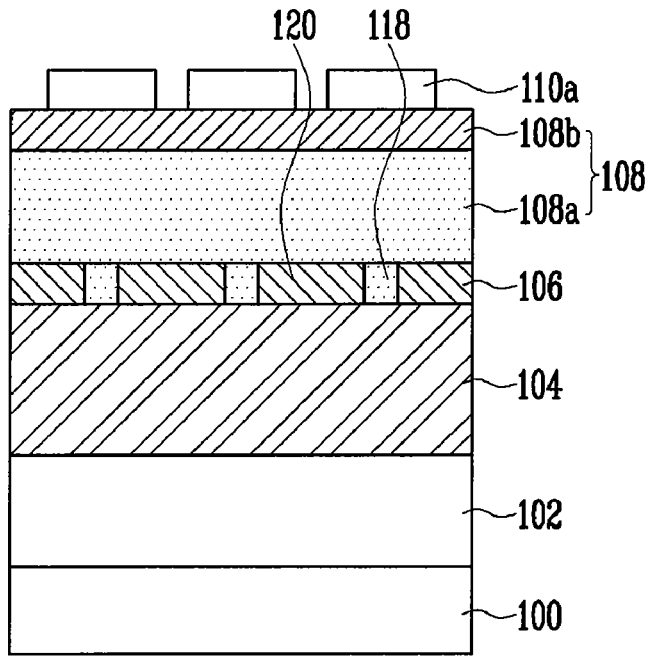

Referring to FIG. 1D, the exposure regions 128 of the second auxiliary layer are removed by a development process, forming second auxiliary patterns (or first mask patterns) 110a. In the development process for forming the second auxiliary patterns 110a, the OARC film 108b formed on the upper side of the isolation layer 108 is not dissolved by a developer. Thus, the organic film 108a of the isolation layer 108 can be protected by the OARC film 108b. Since the organic film 108a is protected, the first auxiliary layer 106 can also be protected.

Figure 1E:
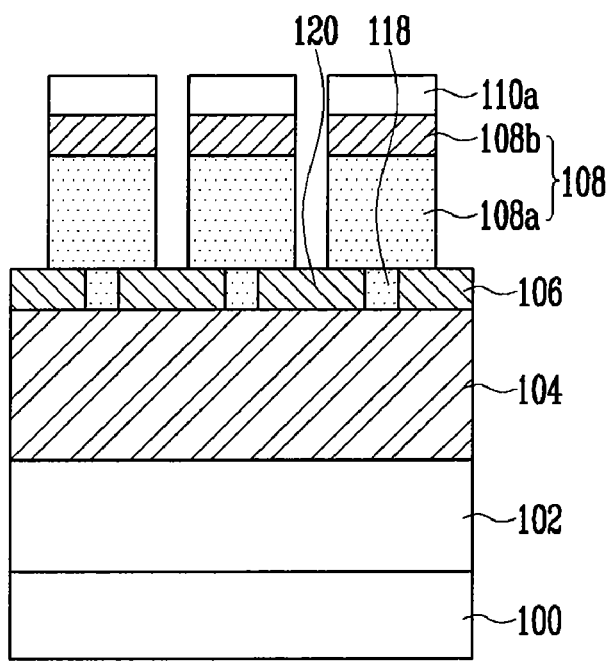

Referring to FIG. 1E, the isolation layer 108 is etched by using the second auxiliary patterns 110a as an etch mask. The isolation layer 108 is etched by a dry etch process employing $O_2$ plasma gas. While the isolation layer 108 is being etched, the top surface of the second auxiliary patterns 110a is partially removed.

Figure 1F:
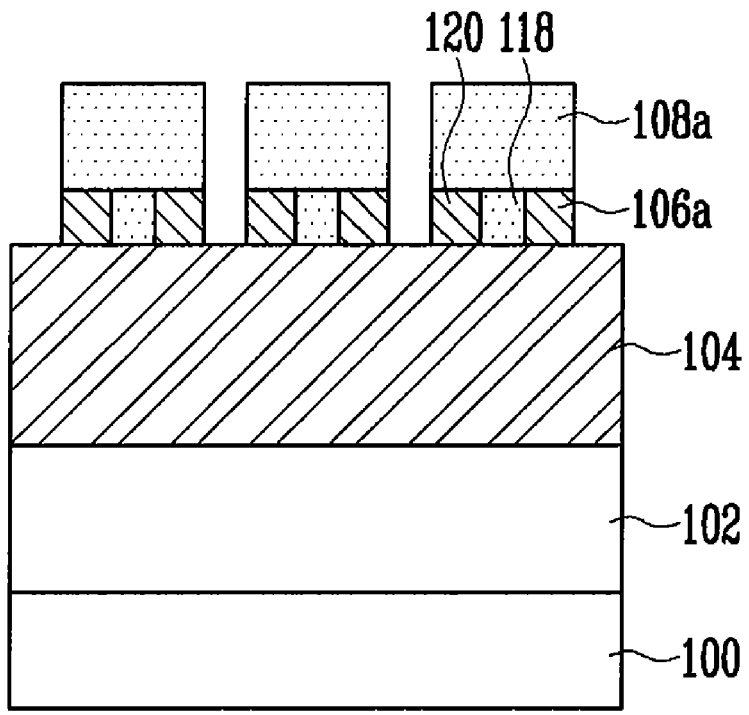

Referring to FIG. 1F, the first auxiliary layer 106 is etched by using the remaining second auxiliary patterns 110a and the etched isolation layer 108 as an etch mask, forming first auxiliary patterns (or second mask patterns) 106a. The second auxiliary patterns 110a has the same etch selectivity as that of the first auxiliary layer. Thus, at the time of the etch process of the first auxiliary layer, the second auxiliary patterns 110a and the OARC film 108b of the isolation layer 108 are removed fully. The organic film 108a of the isolation layer 108, however, partially remains.

Figure 1G:
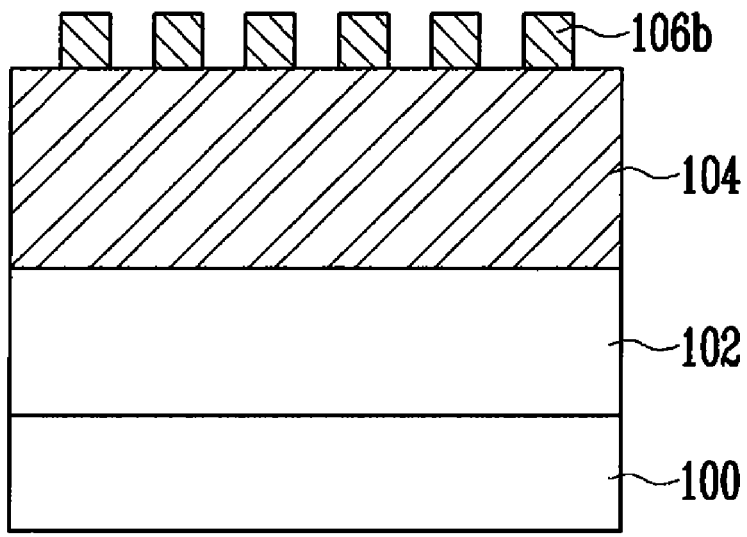

Referring to FIG. 1G, the exposure regions of the remaining organic film 108a and the first auxiliary patterns 106a are developed using a developer, thereby obtaining third auxiliary patterns (or third mask patterns) 106b. As described above, after the first auxiliary patterns are formed by the first auxiliary layer etch process, the exposure regions of the first auxiliary patterns are developed to form the third auxiliary patterns 106b. Consequently, patterns having a target pitch can be formed.

Figure 1H:
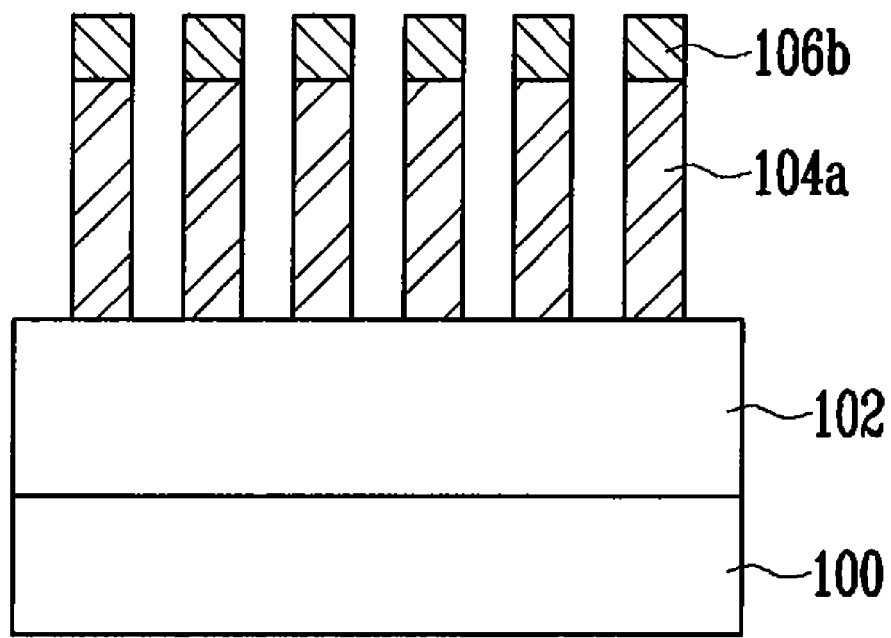

Referring to FIG. 1H, the hard mask film 104 is etched by using the third auxiliary patterns 106b (i.e., patterns having a target pitch) as an etch mask, thereby forming hard mask patterns 104a having a desired line and space.

Figure 1I:
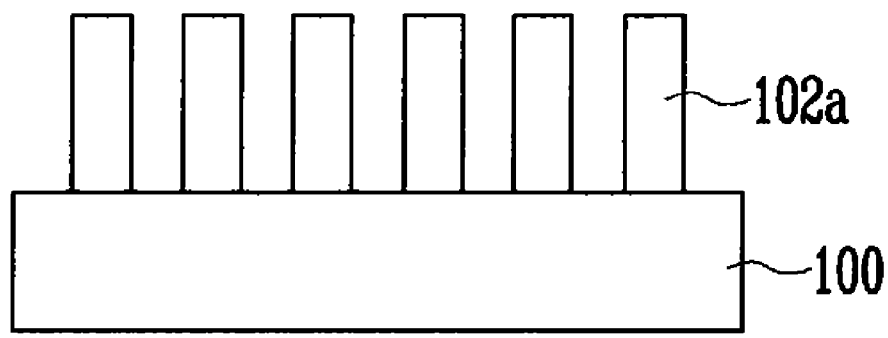

Referring to FIG. 1I, the target etch layer 102 is etched by using the hard mask patterns 104a having a desired line and space as an etch mask, thereby forming target patterns 102a. The remaining third auxiliary patterns 106b and the remaining hard mask patterns 104a are removed.

As described above, a focus is controlled such that the exposure regions 118, 128 and the non-exposure regions 120, 130 are formed in the first auxiliary layer 106 and the second auxiliary layer 110, respectively, by performing an exposure process. The third auxiliary patterns 106b are then formed by means of an etch process. Accordingly, not only micro patterns having a target pitch can be formed, but also process steps can be reduced when compared to the conventional technique. Consequently, production cost can be reduced.

Furthermore, a focus is controlled such that the exposure regions 118, 128 and the non-exposure regions 120, 130 are formed in the first auxiliary layer 106 and the second auxiliary layer 110, respectively, by performing an exposure process. The third auxiliary patterns 106b are then formed by means of an etch process. Accordingly, a micro pattern having various shapes can be formed while removing a problem that a critical dimension (CD) becomes defective by overlay.

As described above, according to the present invention, a focus is controlled such that exposure regions and non-exposure regions are formed in first and second auxiliary layers, respectively, by performing an exposure process. Third auxiliary patterns are then formed by means of an etch process. Accordingly, not only micro patterns having a target pitch can be formed, but also process steps can be reduced when compared to the conventional method.

Further, since process steps are shortened, the cost for mass production can be saved.

In addition, all shapes of micro patterns can be formed while removing a problem that a CD becomes defective by overlay.

Although the foregoing description has been made with reference to the specific embodiments, it is to be understood that changes and modifications of the present patent may be made by the ordinary skilled in the art without departing from the spirit and scope of the present patent and appended claims.

What is claimed is:

1. A method for fabricating a semiconductor device, the method comprising:
    forming a target etch layer over a substrate, a first auxiliary layer over the target etch layer, an isolation layer over the first auxiliary layer, and a second auxiliary layer over the isolation layer;
    performing a first exposure process where the first auxiliary layer is in focus and the second auxiliary layer is out of focus;
    performing a second exposure process where the second auxiliary layer in focus and the first auxiliary layer is out of focus;
    developing the second auxiliary layer to form first mask patterns;
    etching the isolation layer and the first auxiliary layer by using the first mask patterns to form second mask patterns; and
    developing the second mask patterns to form third mask patterns that are used to facilitate subsequent etching of the target etch layer.

2. The method of claim 1, wherein a hard mask layer is provided between the target etch layer and the first auxiliary layer, the method further comprising:
    etching the hard mask layer using the third mask patterns; and
    etching the target etch layer using the hard mask layer that has been etched as a mask layer.

3. The method of claim 1, wherein a hard mask layer is formed between the target etch layer and the first auxiliary layer, wherein the target etch layer is formed of an insulating material or a conductive material.

4. The method of claim 3, wherein the hard mask layer is formed of carbon.

5. The method of claim 4, wherein the hard mask layer is formed of carbon by means of a spin coating method.

6. The method of claim 1, wherein the first auxiliary layer is formed of a material with a different etch selectivity from that of the isolation layer.

7. The method of claim 1, wherein the first auxiliary layer is formed of a photoresist film containing silicon (Si).

8. The method of claim 1, wherein the first auxiliary layer has a stack structure of a bottom anti-reflective coating (BARC) film containing silicon (Si) and a photoresist film.

9. The method of claim 1, wherein the isolation layer is formed of a material having a different etch selectivity from that of the first auxiliary layer and the second auxiliary layer.

10. The method of claim 1, wherein the isolation layer has a stack structure of an organic film and an organic anti-reflection coating (OARC) film.

11. The method of claim 10, wherein the organic film is formed of an organic material that is easily dissolved in a developer.

12. The method of claim 10, wherein the organic film is formed of an emersion top coating material.

13. The method of claim 1, wherein the isolation layer is provided with a given thickness that facilitates putting the first auxiliary layer in focus and the second auxiliary layer out of focus when the first exposure process is being performed.

14. The method of claim 1, wherein the second auxiliary layer is formed of a material with a different etch selectivity from that of the isolation layer.

15. The method of claim 1, wherein the second auxiliary layer is formed of a photoresist film containing silicon (Si).

16. The method of claim 1, wherein exposure regions of the second auxiliary layer are formed between exposure regions of the first auxiliary layer.

17. The method of claim 1, wherein exposure regions of the first auxiliary layer and exposure regions of the second auxiliary layer are spaced apart from one another at specific intervals.

18. The method of claim 1, wherein the first exposure process is performed after the second exposure process.

19. The method of claim 1, wherein the first auxiliary layer or the second auxiliary layer is brought into focus or out of focus by controlling a distance between a mask and the substrate.

20. The method of claim 1, wherein the first mask patterns are provided with a first pitch, the second mask patterns are provided with a second pitch, and the third mask patterns are provided with a third pitch that is smaller than the first pitch or the second pitch.

21. The method of claim 1, wherein the isolation layer is etched by using a dry etch process employing $O_2$ plasma gas.

22. The method of claim 1, wherein at the time of the etch process of the first auxiliary layer, the second auxiliary patterns are fully removed, but the isolation layer partially remains.

23. A method for forming a semiconductor device, the method comprising:
    forming a target etch layer over a substrate, a hard mask layer over the target etch layer, a first auxiliary layer over the target etch layer, an isolation layer over the first auxiliary layer, and a second auxiliary layer over the isolation layer;
    performing a first exposure process on the first auxiliary layer to form first exposure regions and first non-exposure regions;

performing a second exposure process on the second auxiliary layer to form second exposure regions and second non-exposure regions;

developing the second auxiliary layer to form first mask patterns;

etching the isolation layer and the first auxiliary layer by using the first mask patterns to form second mask patterns;

developing the second mask patterns to form third mask patterns;

etching the hard mask layer using the third mask patterns; and etching the target etch layer by using the hard mask layer that has been etched.

24. The method of claim 1, wherein the etching-the-hard-mask-layer step provides the hard mask layer with hard mask patterns that are used to etch the target etch layer, wherein the first mask patterns are provided with a first pitch, the second mask patterns are provided with a second pitch, and the third mask patterns are provided with a third pitch that is smaller than the first pitch or the second pitch.

25. The method of claim 24, wherein the first pitch and the second pitch are the same or different.

26. The method of claim 23, wherein the hard mask film is formed of carbon.

27. The method of claim 26, wherein the hard mask film is formed of carbon by means of a spin coating method.

28. The method of claim 23, wherein the first auxiliary layer is formed of a material with a different etch selectivity from that of the isolation layer.

29. The method of claim 23, wherein the first auxiliary layer is formed of a photoresist film containing silicon (Si).

30. The method of claim 23, wherein the first auxiliary layer has a stack structure of a bottom anti-reflective coating (BARC) film containing silicon (Si) and a photoresist film.

31. The method of claim 23, wherein the isolation layer is formed of a material having a different etch selectivity from that of the first auxiliary layer and the second auxiliary layer.

32. The method of claim 23, wherein the isolation layer has a stack structure of an organic film and an organic anti-reflection coating (OARC) film.

33. The method of claim 32, wherein the organic film is formed of an organic material that is easily melted in a developer.

34. The method of claim 32, wherein the organic film is formed of an emersion top coating material.

35. The method of claim 23, wherein the isolation layer is provided with a given thickness that facilitates putting the first auxiliary layer in focus and the second auxiliary layer out of focus when the first exposure process is being performed.

36. The method of claim 23, wherein the second auxiliary layer is formed of a material with a different etch selectivity from that of the isolation layer.

37. The method of claim 23, wherein the second auxiliary layer is formed of a photoresist film containing silicon (Si).

38. The method of claim 23, wherein the second exposure regions of the second auxiliary layer are formed between the first exposure regions of the first auxiliary layer.

39. The method of claim 23, wherein the first exposure regions of the first auxiliary layer and the second exposure regions of the second auxiliary layer are not formed in the same location, but are spaced apart from one another at specific intervals.

40. The method of claim 23, wherein the first exposure process is performed after the second exposure process.

41. The method of claim 23, wherein at the time of the first exposure process, the first auxiliary layer is brought into focus by controlling a distance between a mask and the substrate so that the first exposure regions are formed only in the first auxiliary layer.

42. The method of claim 23, wherein at the time of the second exposure process, the second auxiliary layer is brought into focus by controlling a distance between a mask and the substrate so that the second exposure regions are formed only in the second auxiliary layer.

43. The method of claim 23, wherein the isolation layer is etched by using a dry etch process employing $O_2$ plasma gas.

44. The method of claim 23, wherein at the time of the etch process of the first auxiliary layer, the second auxiliary patterns are fully removed, but the isolation layer partially remains.

* * * * *